(12) United States Patent
Yamamoto

(10) Patent No.: US 11,101,749 B2
(45) Date of Patent: Aug. 24, 2021

(54) VIBRATION WAVE MOTOR AND IMAGING DEVICE HAVING VIBRATION WAVE MOTOR

(71) Applicant: CANON KABUSHIKI KAISHA, Tokyo (JP)

(72) Inventor: Harushige Yamamoto, Yamato (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 750 days.

(21) Appl. No.: 15/941,807

(22) Filed: Mar. 30, 2018

(65) Prior Publication Data

US 2018/0287513 A1 Oct. 4, 2018

(30) Foreign Application Priority Data

Mar. 31, 2017 (JP) .............................. JP2017-069716

(51) Int. Cl.
| | | |
|---|---|---|
| *H02N 2/02* | (2006.01) | |
| *H02N 2/06* | (2006.01) | |
| *B06B 1/06* | (2006.01) | |
| *H05K 1/03* | (2006.01) | |
| *H01L 41/047* | (2006.01) | |
| *G02B 7/10* | (2021.01) | |
| *G02B 7/08* | (2021.01) | |

(Continued)

(52) U.S. Cl.
CPC ............ *H02N 2/026* (2013.01); *B06B 1/0644* (2013.01); *G02B 7/08* (2013.01); *G02B 7/10* (2013.01); *H01L 41/0475* (2013.01); *H02N 2/0025* (2013.01); *H02N 2/06* (2013.01); *H05K 1/0393* (2013.01); *H05K 1/189* (2013.01); *H05K 2201/10083* (2013.01)

(58) Field of Classification Search
CPC ........ H02N 2/026; H02N 2/06; B06B 1/0644; H05K 1/0393; H01L 41/0475
See application file for complete search history.

(56) References Cited

U.S. PATENT DOCUMENTS

| | | | |
|---|---|---|---|
| 9,827,593 B2* | 11/2017 | Yamamoto | ............. H02N 2/026 |
| 2007/0019950 A1* | 1/2007 | Tanaka | .................. G03B 17/02 |
| | | | 396/462 |

(Continued)

FOREIGN PATENT DOCUMENTS

| | | |
|---|---|---|
| JP | 2007033699 A | 2/2007 |
| JP | 2016-140127 A | 8/2016 |

OTHER PUBLICATIONS

English Translation of JP 2016140127 Yamanaka (Year: 2016).*
Japanese Office Action dated Dec. 1, 2020, for Corresponding Japanese Application No. 2017-069716.

*Primary Examiner* — Bryan P Gordon
(74) *Attorney, Agent, or Firm* — Carter, DeLuca & Farrell LLP

(57) ABSTRACT

A vibration wave motor has a vibrator vibrating by a drive voltage to be applied, a flexible printed circuit board supplying the drive voltage to the vibrator, a contact member with which a pressure contact portion formed in the vibrator is brought into pressure contact, and a pressurizing section pressurizing the vibrator against the contact member, in which the vibrator and the contact member move relative to each other, and the flexible printed circuit board extends along the relative movement direction from a side portion of the vibrator and further extends so as to surround the vibrator.

8 Claims, 5 Drawing Sheets

(51) Int. Cl.
  *H02N 2/00* (2006.01)
  *H05K 1/18* (2006.01)

(56) References Cited

U.S. PATENT DOCUMENTS

| | | | | |
|---|---|---|---|---|
| 2016/0149114 A1* | 5/2016 | Shiono | .................. | H02N 2/006 |
| | | | | 359/814 |
| 2017/0028441 A1* | 2/2017 | Kagayama | .............. | H01L 41/09 |
| 2018/0296195 A1* | 10/2018 | Okuda | ................... | A61B 8/546 |

\* cited by examiner

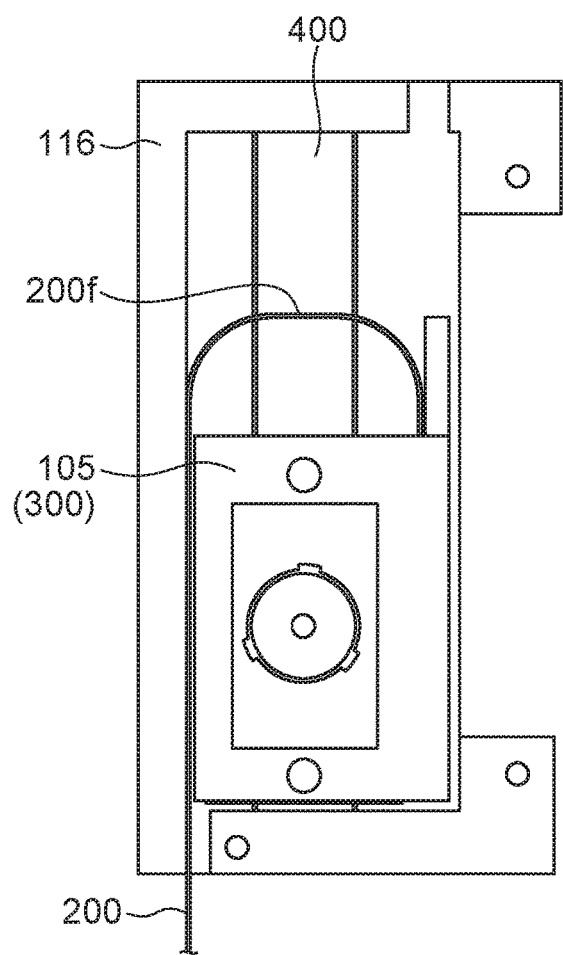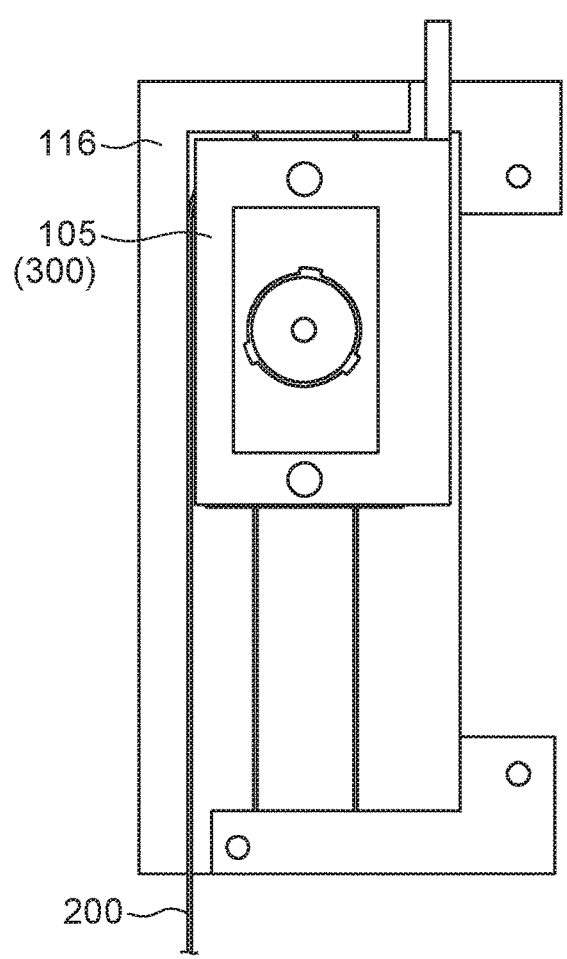

VIBRATION WAVE MOTOR AND IMAGING DEVICE HAVING VIBRATION WAVE MOTOR

BACKGROUND OF THE INVENTION

Field of the Invention

The present invention relates to a vibration wave motor to be applied to an optical instrument and the like and an imaging device having the vibration wave motor.

Description of the Related Art

Heretofore, this kind of ultrasonic motor drives a slide member by bringing a vibrator periodically vibrating by the application of a high frequency voltage into pressure contact with the slide member and is disclosed in Japanese Patent Application Laid-Open No. 2016-140127, for example.

SUMMARY OF THE INVENTION

According to a former technique disclosed in Japanese Patent Application Laid-Open No. 2016-140127, a flexible substrate has a root portion extending along a movement direction in one side portion of a vibrator, a bent portion bent in a U-shape to the outside of the vibrator, and a bottom board side fixing portion extending again. This configuration requires storage space for the flexible substrate to extend to the outside of the vibrator, which has posed a problem of enlargement of a device.

Then, it is an object of the present invention to provide a miniaturized vibration wave motor by eliminating storage space for a flexible printed circuit board supplying power to the vibrator.

In order to achieve the above-described object, a vibration wave motor of the present invention has a vibrator vibrating by a drive voltage to be applied, a flexible printed circuit board supplying the drive voltage to the vibrator, a contact member with which a pressure contact portion formed in the vibrator is brought into pressure contact, and a pressurizing section pressurizing the vibrator against the contact member, in which the vibrator and the contact member move relative to each other, and the flexible printed circuit board extends along the relative movement direction from a side portion of the vibrator and further extends so as to surround the vibrator.

The present invention can provide a miniaturized vibration wave motor by eliminating storage space for a flexible printed circuit board.

Further features of the present invention will become apparent from the following description of exemplary embodiments with reference to the attached drawings.

BRIEF DESCRIPTION OF THE DRAWINGS

FIGS. 4A and 4B each are plan views of the vibration wave motor of the embodiment of the present invention.

DESCRIPTION OF THE EMBODIMENTS

Preferred embodiments of the present invention will now be described in detail in accordance with the accompanying drawings.

Figure 1:
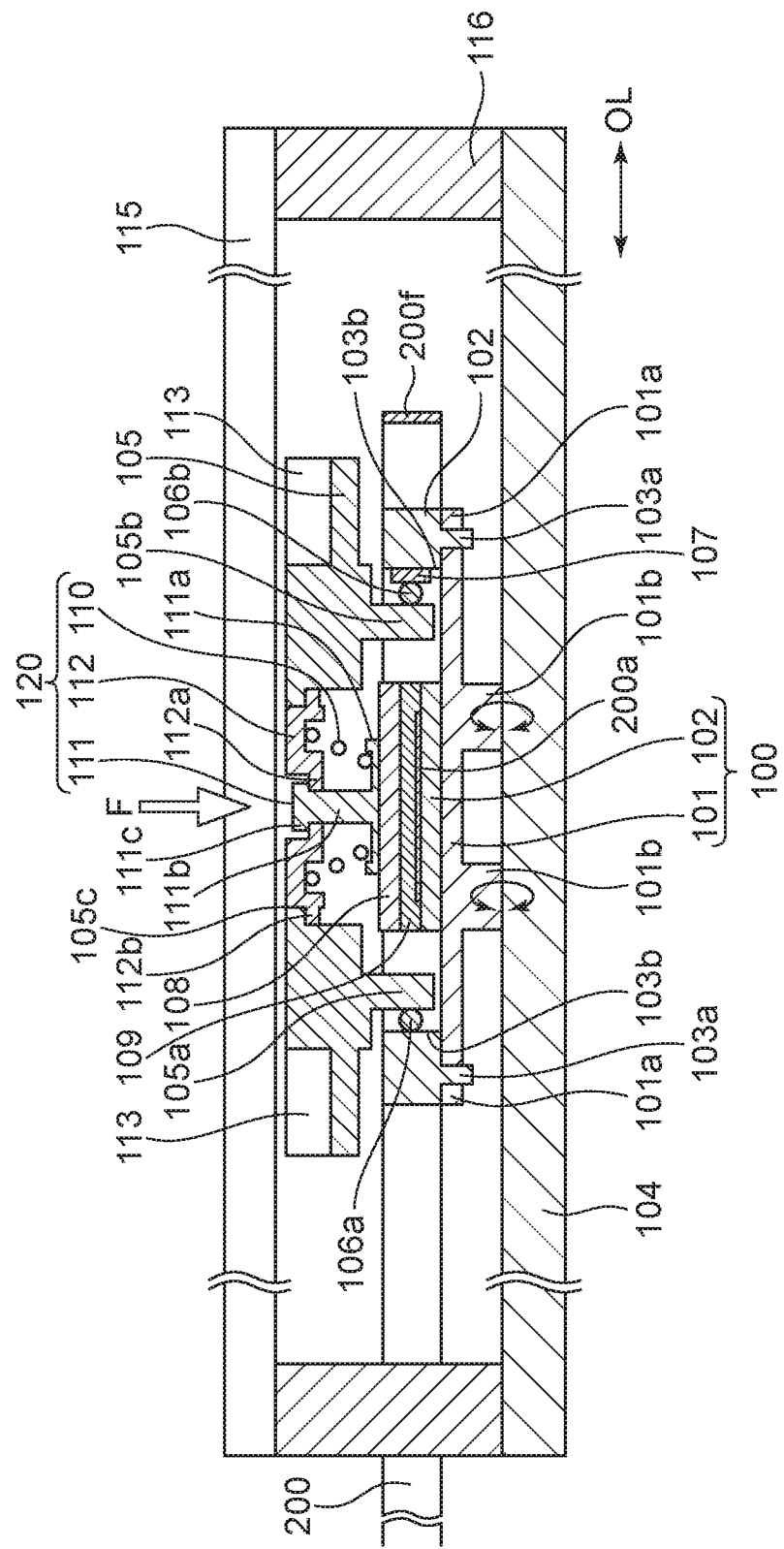
FIG. 1 is a cross-sectional view in the movement direction of a vibration wave motor of an embodiment of the present invention.
Figure 2:
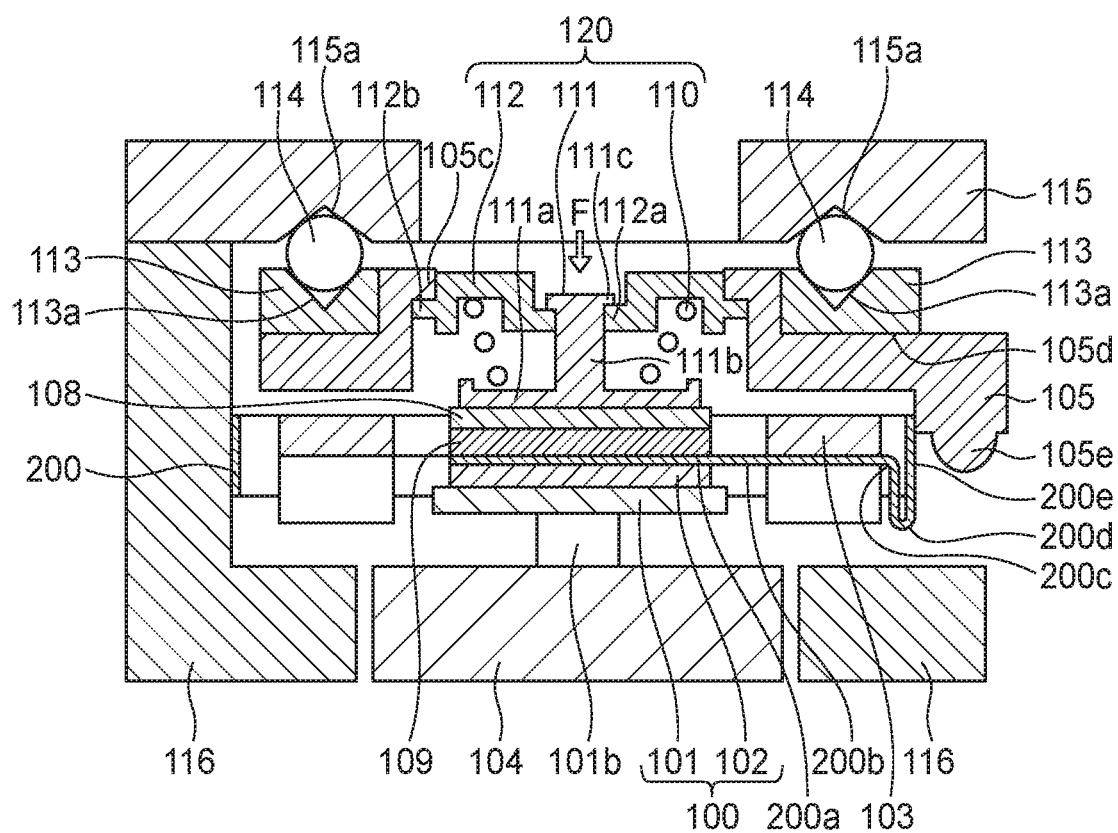
FIG. 2 is a cross-sectional view in a direction orthogonal to the movement direction of the vibration wave motor of the embodiment of the present invention.
Figure 3:
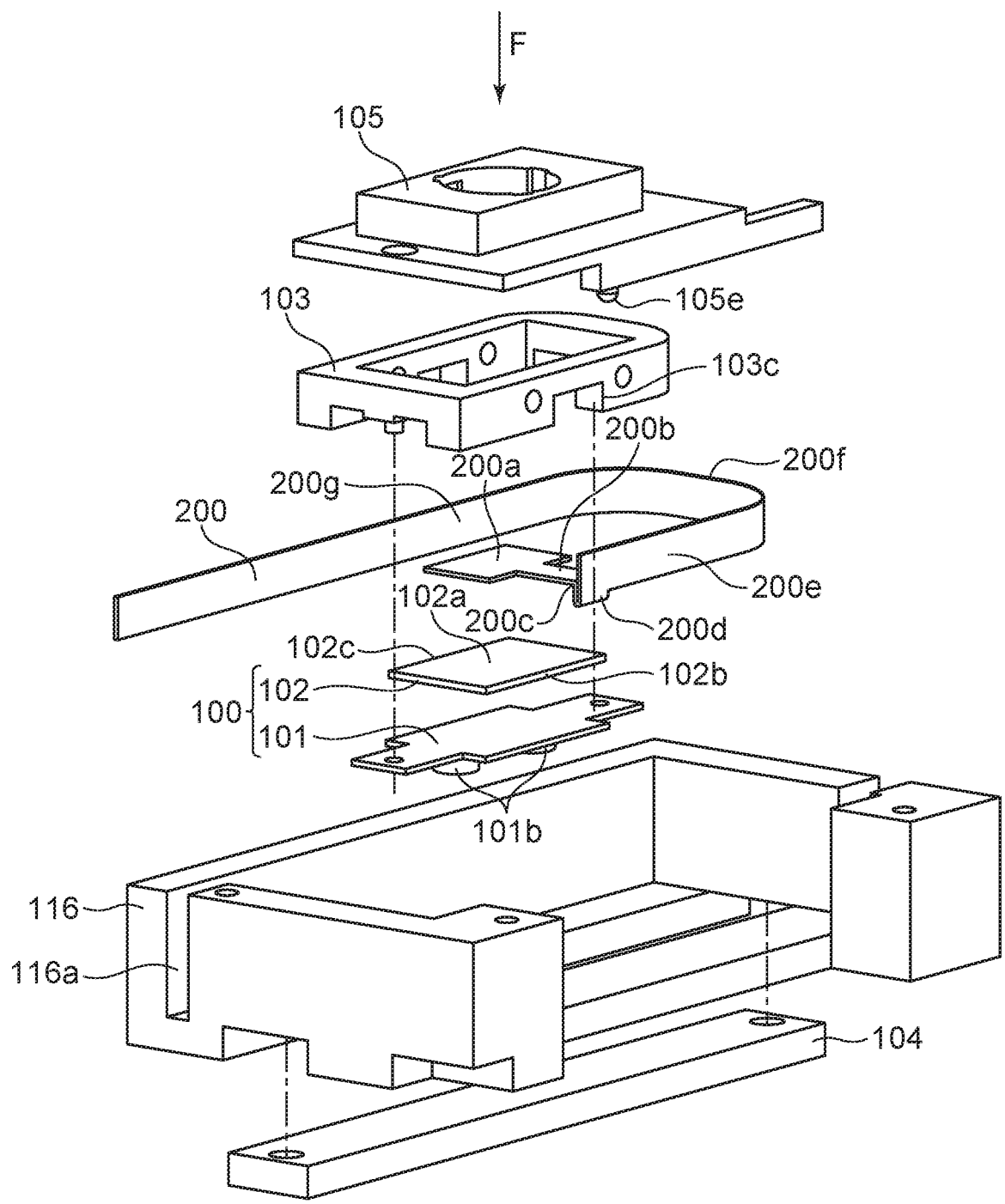
FIG. 3 is an exploded perspective view of a principal portion of the vibration wave motor of the embodiment of the present invention.

FIG. 1 is a cross-sectional view in the movement direction of a vibration wave motor illustrating an embodiment of the present invention. FIG. 2 is a cross-sectional view in a direction orthogonal to the movement direction. FIG. 3 is an exploded perspective view of a principal portion of the vibration wave motor. The vibration wave motor of the present invention contains members described below.

As illustrated in FIG. 1, the vibration wave motor (ultrasonic motor) has a vibrator 100 containing a vibrating plate 101 and a piezoelectric element 102. To the vibrating plate 101, the piezoelectric element 102 having an electrode portion 102a (refer to FIG. 3) is fixed with a known adhesive or the like. To the electrode portion 102a of the piezoelectric element 102, a flexible printed circuit board 200 (refer to FIG. 3) for supplying power is fixed. When a high frequency drive voltage is applied to the piezoelectric element 102 from the flexible printed circuit board 200, the vibrating plate 101 causes resonance in each of the longitudinal direction and the lateral direction. The vibrator 100 is configured so as to cause vibration (ultrasonic vibration) of a frequency in an ultrasonic region by application of a high frequency drive voltage.

By the resonance due to the ultrasonic vibration, two pressure contact portions 101b formed in the vibrating plate 101 cause elliptical movement. By varying the frequency and the phase of the high frequency drive voltage to be applied to the piezoelectric element 102, the rotational direction and the elliptical ratio of the elliptical movement can be varied as appropriate, whereby desired movement can be caused. Thus, due to frictional contact between a slider 104 (contact member) and the pressure contact portions 101b which are the mating portions of the vibrating plate 101, driving force causing relative movement of the vibrating plate 101 and the slider 104 is generated. Then, the vibrator 100 itself can be driven with an optical axis OL (horizontal direction in FIG. 1) as the relative movement direction. The slider 104 is fixed to a unit support member 116 described later by a known fastening means, such as a screw.

The vibrating plate 101 has portions to be joined 101a in both end portions in the movement direction and joining convex portions 103a of a base 103 are fixed to the portions to be joined 101a by means, such as adhesion. The base 103 contains a frame body having a square shape as viewed in plane (refer to FIG. 3) and the joining convex portions 103a are provided in both end portions in the movement direction. The base 103 to which the vibrator 100 is fixed is connected to a vibrator support member 105 by a connection means described later.

Although the vibrating plate 101 contacts one surface of the piezoelectric element 102 as described above, an elastic member 109 is provided on the other surface thereof. On the surface opposite to the surface contacting the piezoelectric element 102 of the elastic member 109, a pressurizing plate 108 is provided. More specifically, the pressurizing plate 108 pressure-holds the piezoelectric element 102 with the elastic member 109 interposed therebetween. The elastic member 109 has a role of transmitting pressurization force F described later to the vibrator 100 without attenuating the ultrasonic vibration to be generated in the piezoelectric element 102.

The pressurizing plate 108 receives the pressurization force F generated by a pressurization spring 110 through a tip pressurization portion 111a formed on one side of a spring holding member 111 in a pressurization direction illustrated in FIG. 1. The spring holding member 111 contains the above-described tip pressurization portion 111a, a shaft portion 111b extending from the tip pressurization portion 111a, and a tip large-diameter portion 111c having a diameter larger than the diameter of the shaft portion 111b. The pressurization spring 110 is incorporated between the tip pressurization portion 111a of a spring holding member 111 and a spring bottom board 112 and is configured as a pressurization spring unit. The tip large-diameter portion 111c of the spring holding member 111 is incorporated into a fitting portion 112a of the spring bottom board 112 by light press-fitting, and therefore a unit state can be maintained against the pressurization force F of the pressurization spring 110 after assembly.

In an outer diameter portion in the circumferential direction of the spring bottom board 112, bayonet protruding portions 112b are formed in several places. The bayonet protruding portions 112b are engaged with bayonet engagement portions 105c formed in the vibrator support member 105, so that the position in the pressurization direction is specified.

In the tip pressurization portion 111a of the spring holding member 111, the pressurization force F is generated by the biasing force of the pressurization spring 110. The vibrator 100 is pressurized against the slider 104 through the pressurizing plate 108 and the elastic member 109 by the pressurization force F, so that the vibrator 100 and the slider 104 can be brought into frictional contact with each other. The pressurization spring 110, the spring holding member 111, and the spring bottom board 112 configure a pressurizing section 120. Then, an actuator 300 containing the pressurizing section 120 and the vibrator 100 as constituent components is configured.

Next, a connection means connecting the vibrator support member 105 and the base 103 is described. In the vibrator support member 105, two connecting protruding portions 105a and 105b provided extending in the pressurization direction are formed so as to be separated from each other in the movement direction and roller shafts 106a and 106b which are rolling members are disposed between the base 103 facing these connecting protruding portions 105a and 105b, respectively. More specifically, the rolling members are provided on both sides with the pressure contact portions 101b of the vibrating plate 101 interposed therebetween and at two places at the front and rear portions in the movement direction of the vibrator 100. Furthermore, one roller shaft 106a is incorporated between one connecting protruding portion 105a and the connection portion 103b of the base 103 (left side of FIG. 1). Between the other connecting protruding portion 105b and the connection portion 103b of the base 103 (right side of FIG. 1), the other roller shaft 106b and a plate spring 107 which is an elastic energization member are incorporated.

In the state where both the plate spring 107 and the other roller shaft 106b are incorporated, the vibrator support member 105 is biased in the left direction of FIG. 1 through the other roller shaft 106b and the base 103 is biased in the right direction of FIG. 1 by the biasing force of the plate spring 107. The biasing force of the plate spring 107 is given in a direction perpendicular to the pressurization direction of the vibrator 100.

The one roller shaft 106a is also held between the one connecting protruding portion 105a of the vibrator support member 105 and the other connection portion 103b of the base 103. This configuration can realize a connection means which is free from the occurrence of backlash in the movement direction and in which slide resistance hardly generates due to the action of the rolling members in the pressurization direction. Herein, the biasing force of the plate spring 107 is set so as to be higher than the force of inertia by the acceleration and deceleration generated when starting and stopping an operation of the vibrator support member 105 and a target to be driven. Due to this setting, the base 103, the vibrator 100 and the vibrator support member 105 can realize stabilized drive control free from the occurrence of relative displacement in the movement direction by the force of inertia in driving.

Moving plates 113 are fixed to abutment portions 105d of the vibrator support member 105 by known methods, such as adhesion or screwing and configure a part of a guide portion. More specifically, a plurality of V-groove portions 113a into which balls 114 are fitted and in which the balls 114 roll is formed in the moving plates 113. By the rolling of the balls 114, the vibrator support member 105 is guided in the movement direction.

A cover plate 115 is fixed to the unit support member 116 by a known screw or the like. As illustrated in FIG. 2, the cover plate 115 also configures a part of the guide portion. The balls 114 are held by V-groove portions 115a provided at positions facing the V-groove portions 113a of the moving plate 113. This configuration makes it possible to retractably support the vibrator support member 105 along the movement direction. By the above-described configuration, a direct-acting vibration wave motor of the present invention is completed.

Next, the laying of the flexible printed circuit board 200 which is a characteristic configuration of the present invention is described. FIG. 3 is an exploded perspective view of a principal portion illustrating the arrangement of the flexible printed circuit board 200 to be applied to the vibration wave motor of the present invention. The same constituent components as those of the contents described in the above-described embodiment are designated by the same reference numerals and descriptions of members configuring the pressurizing section 120 and the like are omitted.

In the flexible printed circuit board 200, a fixing portion 200a to be fixed to the electrode portion 102a of the piezoelectric element 102 with a known conductive adhesive or the like is formed. Furthermore, in the flexible printed circuit board 200, a drawer portion 200b, a bent portion 200c, a folded-back portion 200d, an extension portion 200e, a U-turn portion 200f, and an extension portion 200g which are successively connected from the fixing portion 200a are formed and form a wiring portion. Hereinafter, the configuration of the flexible printed circuit board 200 is described in detail.

The wiring portion extending from the fixing portion 200a of the flexible printed circuit board 200 is drawn out from a side portion 102b side of the piezoelectric element 102 along the movement direction to form the drawer portion 200b. A wiring escape portion 103c is formed in the base 103 along the movement direction of the vibrator 100 so that the drawer portion 200b does not interfere with the base 103. In the wiring portion containing the drawer portion 200b, the bent portion 200c bent by about 90° in the pressurization direction of the pressurization force F is formed on the side separated from the fixing portion 200a, and thereafter the flexible printed circuit board 200 extends in the pressurization direction.

In the flexible printed circuit board 200 extending from the bent portion 200c, the folded-back portion 200d folded-back by about 180° in a direction opposite to the pressurization direction is formed and the flexible printed circuit board 200 extends in the direction opposite to the pressurization direction. Next, the wiring portion of the flexible printed circuit board 200 extending from the folded-back portion 200d changes the direction in the movement direction of the vibrator 100, and then extends along the movement direction, so that the extension portion 200e is formed.

The extension portion 200e can freely adjust the height in the pressurization direction by the configuration of the bent portion 200c bent by about 90° in the pressurization direction and the folded-back portion 200d folded-back by about 180° in the direction opposite to the pressurization direction. By forming such a bent structure, the space in the height direction in the vibration wave motor can be effectively used, and therefore the miniaturization of the device is achieved.

Next, the U-turn portion 200f is formed in the wiring portion containing the extension portion 200e so as to change the extending direction in a movement region 400 (refer to FIG. 4A) in the movement direction of the actuator 300 containing the pressurizing section 120 and the vibrator 100. In the wiring portion of the flexible printed circuit board 200, the extension portion 200g is formed which extends along another side portion 102c side facing the side portion 102b of the piezoelectric element 102 after the extending direction is reversed in the U-turn portion 200f, and then extends in the movement direction of the vibrator 100. More specifically, the U-turn portion 200f extends so as to surround the vibrator 100. Then, the wiring portion of the flexible printed circuit board 200 is drawn out to the outside of the vibration wave motor from a notch portion 116a provided in the unit support member 116 to be connected to a power supply outside the figure.

FIGS. 4A and 4B are plan views illustrating the laying state of the flexible printed circuit board 200 to be applied to the vibration wave motor of the present invention, in which the same constituent components as those in the contents described in the above-described embodiment are designated by the same reference numerals. FIG. 4A illustrates a state where the vibrator support member 105 containing the actuator 300 is located in one end portion of the unit support member 116. FIG. 4B illustrates a state where the vibrator support member 105 containing the actuator 300 is located in the other end portion of the unit support member 116.

Referring to FIG. 4A, the U-turn portion 200f (folded-back bent portion) changing the extending direction is formed in the flexible printed circuit board 200 in the movement region 400 of the actuator 300. Then, the position of the U-turn portion 200f gradually changes to the other end portion side with the movement of the vibrator support member 105 containing the actuator 300 from the one end portion to the other end portion in the unit support member 116. More specifically, the relative position of the bent portion of the flexible printed circuit board 200 to the vibrator 100 changes.

As described above, the optimization of the laying of the flexible printed circuit board 200 eliminates the necessity of space required for performing U-turn in the side portion 102b of the piezoelectric element 102 unlike former techniques, so that the miniaturization of the device can be realized.

Figure 5:
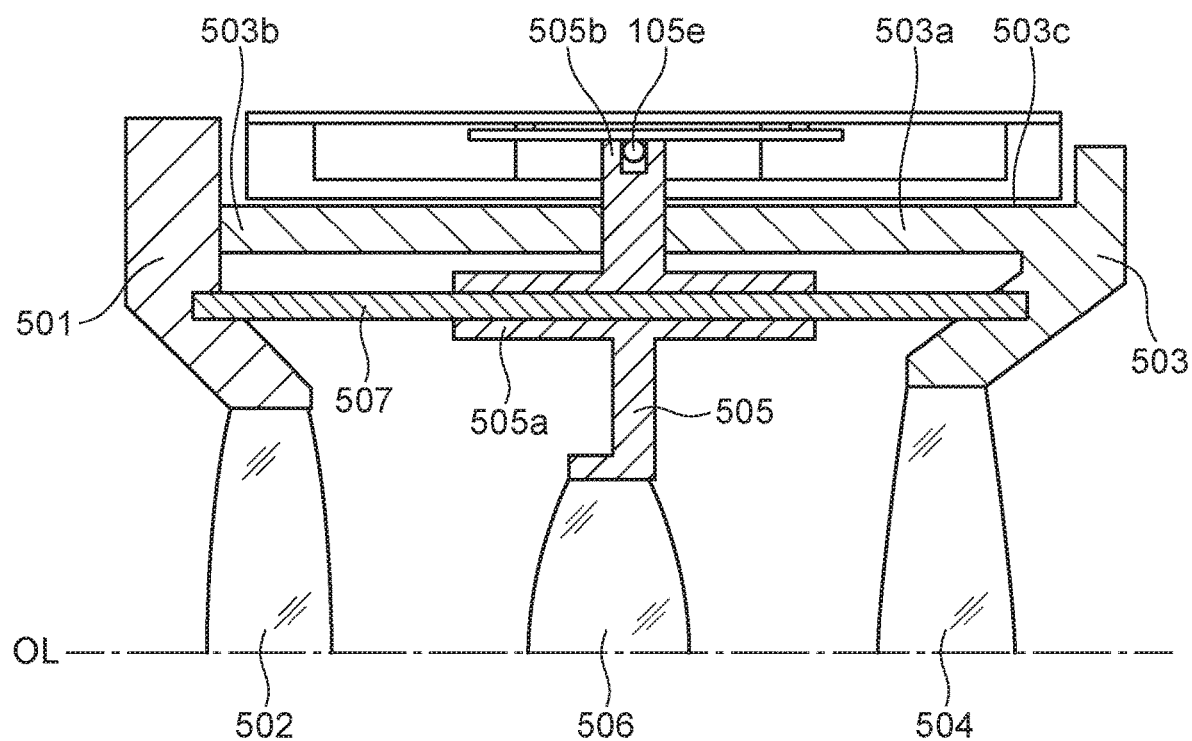
FIG. 5 is a cross-sectional view in a state where the vibration wave motor of the present invention is incorporated into a lens barrel portion.

FIG. 5 is a cross-sectional view illustrating an application example in which the vibration wave motor of the present invention is incorporated into a lens device (lens barrel portion) of an imaging device. A first lens holding member 501 holds a first lens 502 and a third lens holding member 503 holds a third lens 504. An outer peripheral portion of the third lens holding member 503 has a cylindrical portion 503a and the first lens holding member 501 is fastened with a known screw or the like at a tip portion 503b of the cylindrical portion 503a. In a part of an outer diameter portion of the cylindrical portion 503a, a unit receiving portion 503c to which the vibration wave motor is fixed is provided and is detachably fixed with a known screw or the like.

In an inner diameter portion of the cylindrical portion 503a, a second lens holding member 505 holding a second lens 506 is disposed. The second lens 506 moves as a focusing lens along the optical axis OL by the vibration wave motor of the present invention. Herein, a known guide bar 507 and a bearing portion 505a are fitted to each other so as to be relatively slidable, and therefore the second lens holding member 505 can move the second lens 506 along the optical axis OL.

The connection between the second lens holding member 505 and the vibrator support member 105 may be performed by the engagement of an engagement pin 105e provided in the vibrator support member 105 and a portion to be engaged 505b provided in the second lens holding member 505, for example. Moreover, the connection may be performed by known rack and pin.

As described above, in the present invention, the U-turn portion 200f of the flexible printed circuit board 200 supplying a high frequency drive voltage to the vibrator 100 is configured so as to change the extending direction in the movement region of the actuator 300. The formation of such a configuration eliminates the necessity of space for storing the flexible printed circuit board 200 in the outside of the vibrator 100, so that the miniaturization of the device can be achieved.

As described above, a specific example of the laying of the flexible printed circuit board 200 of the vibration wave motor according to the present invention is described in detail but the present invention is not limited to the embodiment and can take any aspect insofar as the aspect is described in Claims.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-069716, filed Mar. 31, 2017, which is hereby incorporated by reference herein in its entirety.

What is claimed is:

1. A vibration wave motor comprising:
    a vibrator containing a vibrating plate and a piezoelectric element fixed with the vibrating plate, and vibrating by a drive voltage to be applied to the piezoelectric element;
    a flexible printed circuit board supplying the drive voltage to the piezoelectric element; and
    a pressurizing section pressurizing the vibrator against a contact member, wherein the vibrator and the contact member move relative to each other in a direction orthogonal to a pressurizing direction of the pressurizing section by applying the drive voltage to the piezoelectric element, and the flexible printed circuit board is fixed to a surface intersecting of the pressurizing direction of the piezoelectric element and extends from a side portion of the vibrator along a first direction parallel to a relative movement direction of the vibrator, and the contact member then bends toward the vibrator and further extends along a second direction opposite to the first direction.

2. The vibration wave motor according to claim 1, wherein
the side portion is a side portion along the relative movement direction of the vibrator.

3. The vibration wave motor according to claim 1, wherein
the flexible printed circuit board is bent so as to change an extending direction from the first direction to the second direction in a part in a movement region of an actuator containing the vibrator and the pressurizing section.

4. The vibration wave motor according to claim 1, wherein
the flexible printed circuit board extending from the side portion of the vibrator is bent by about 90° in a pressurization direction of the pressurizing section and extends along the relative movement direction.

5. The vibration wave motor according to claim 1, wherein
the flexible printed circuit board extending from the side portion of the vibrator is bent by about 90° in the pressurization direction of the pressurizing section, extends, is folded-back by about 180° to extend in a direction opposite to the pressurization direction, and then extends along the relative movement direction.

6. The vibration wave motor according to claim 1, wherein
the vibration wave motor is an ultrasonic motor using vibration of a frequency in an ultrasonic region.

7. A lens device comprising:
a vibration wave motor;
a lens moving by the vibration wave motor,
wherein the vibration motor comprises:
a vibrator containing a vibrating plate and a piezoelectric element fixed with the vibrating plate, vibrating by a drive voltage to be applied to the piezoelectric element,
a flexible printed circuit board supplying the drive voltage to the piezoelectric element, and
a pressurizing section pressurizing the vibrator against a contact member, and wherein
the vibrator and the contact member move relative to each other in a direction orthogonal to a pressurizing direction of the pressurizing section by applying the drive voltage to the piezoelectric element, and
the flexible printed circuit board is fixed to a surface intersecting of the pressurizing direction of the piezo electric element and extends from a side portion of the vibrator along a first direction parallel to a relative movement direction of the vibrator, and the contact member then bends toward the vibrator and further extends along a second direction opposite to the first direction.

8. An imaging device comprising:
a vibration wave motor having
a vibrator containing a vibrating plate and a piezoelectric element fixed with the vibrating plate, and vibrating by a drive voltage to be applied to the piezoelectric element,
a flexible printed circuit board supplying the drive voltage to the piezoelectric element, and
a pressurizing section pressurizing the vibrator against a contact member, wherein
the vibrator and the contact member move relative to each other in a direction orthogonal to a pressurizing direction of the pressurizing section by applying the drive voltage to the piezoelectric element, and
the flexible printed circuit board is fixed to a surface intersecting of the pressurizing direction of the piezoelectric element and extends from a side portion of the vibrator along a first direction parallel to a relative movement direction of the vibrator, and the contact member then bends toward the vibrator and further extends along a second direction opposite to the first direction.

* * * * *